(12) United States Patent
Yanagimoto et al.

(10) Patent No.: US 7,347,894 B2
(45) Date of Patent: Mar. 25, 2008

(54) PIGMENT DISPERSANTS AND THEIR USE

(75) Inventors: Hiromitsu Yanagimoto, Chuo-ku (JP); Hiroaki Saikatsu, Chuo-ku (JP); Naoto Kamata, Chuo-ku (JP); Shigeru Sakamoto, Chuo-ku (JP); Akio Yoshida, Chuo-ku (JP); Michiei Nakamura, Chuo-ku (JP)

(73) Assignee: Dainichiseika Color & Chemicals Mfg. Co., Ltd., Tokyo (JP)

( * ) Notice: Subject to any disclaimer, the term of this patent is extended or adjusted under 35 U.S.C. 154(b) by 148 days.

(21) Appl. No.: 11/398,654

(22) Filed: Apr. 6, 2006

(65) Prior Publication Data

US 2006/0241227 A1 Oct. 26, 2006

(30) Foreign Application Priority Data

Apr. 19, 2005 (JP) ............................. 2005-121044

(51) Int. Cl.
| | |
|---|---|
| C09B 67/20 | (2006.01) |
| C09B 67/00 | (2006.01) |
| C09B 67/22 | (2006.01) |
| C09B 67/36 | (2006.01) |
| C09B 67/46 | (2006.01) |
| C09B 33/00 | (2006.01) |
| C08K 5/13 | (2006.01) |
| G02B 5/20 | (2006.01) |
| G02B 5/22 | (2006.01) |
| G02F 1/13 | (2006.01) |
| G03F 7/00 | (2006.01) |

(52) U.S. Cl. ...................... 106/496; 106/410; 106/413; 106/493; 106/494; 106/495; 106/497; 106/498; 106/499; 349/106; 353/84; 427/162; 430/7; 524/157; 524/190; 524/342; 534/588

(58) Field of Classification Search ................ 106/410, 106/413, 493, 494, 495, 496, 497, 498, 499; 349/106; 353/84; 427/162; 430/7; 524/157, 524/190, 342; 534/588
See application file for complete search history.

(56) References Cited

U.S. PATENT DOCUMENTS

| 5,961,711 A | 10/1999 | Saikatsu et al. |
| 6,005,085 A * | 12/1999 | Ueno et al. ............... 534/651 |
| 6,299,676 B1 | 10/2001 | Saikatsu et al. |
| 6,302,953 B1 | 10/2001 | Saikatsu et al. |
| 6,471,766 B2 | 10/2002 | Ohki et al. |
| 2005/0048384 A1 | 3/2005 | Saikatsu et al. |
| 2006/0185558 A1* | 8/2006 | Saikatsu et al. ............ 106/493 |
| 2006/0241227 A1* | 10/2006 | Yanagimoto et al. ....... 524/342 |

FOREIGN PATENT DOCUMENTS

| JP | 60-237403 | 11/1985 |
| JP | 60-247603 | 12/1985 |
| JP | 2000-160084 | 6/2000 |

* cited by examiner

Primary Examiner—Anthony J Green
(74) Attorney, Agent, or Firm—Oblon, Spivak, McClelland, Maier & Neustadt, P.C.

(57) ABSTRACT

There is disclosed a pigment dispersant comprises the compound represented by the following formula (I) or a metal salt, ammonium salt, amine salt or alkylammoniumchloride salt thereof.

Also disclosed are a colored composition for CF, a process for the fabrication of a CF, the color filter fabricated by the process, an image display device including the color filter, and an information communication equipment including the image display device. These colored composition, process, color filter, image display device and information communication equipment all make either direct or indirect use of the pigment dispersant Formula (I)

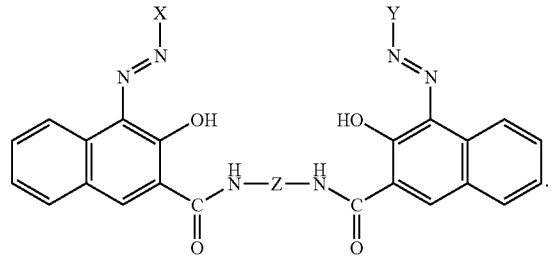

11 Claims, No Drawings

PIGMENT DISPERSANTS AND THEIR USE

FIELD OF THE INVENTION

This invention relates to pigment dispersants, colored compositions for color filters (hereinafter simply called "CF") useful in the fabrication of liquid-crystal color displays or image pickup devices, and CF making use of the colored compositions. More specifically, this invention is concerned with colored compositions for CF, said compositions being excellent in pigment dispersing ability, transparency, fluidity and storage stability, and also with CF making use of the colored compositions.

DESCRIPTION OF THE BACKGROUND

Nowadays, CF for use in a liquid crystal display or the like are each fabricated mainly by applying a colored composition, which is formed of a photoresist and a pigment dispersed therein, onto a substrate by a spin-coating method, coating method or transfer method, exposing the thus-applied colored composition to light, radiation or the like through a photomask, and then performing development to form pixels. Upon fabrication of such CF, a anthraquinone pigment, a diketopyrrolopyrrole pigment and a condensed azo pigment is generally used as a pigment for the formation of red pixels. Mere dispersion of this pigment together with a resin, a solvent and the like by a conventional disperser, however, cannot bring the pigment into a fully-dispersed form. When the thus-prepared dispersion is used for the formation of color pixels for the CF, the resulting red pixels lack transparency and have insufficient transmission as pixels for CF. The red pigment is, therefore, dissatisfactory as a pigment for use in a colored composition for CF. It is to be noted that the dispersion may mean a "colored composition for CF" in some instances.

As resins for use in photoresists, acrylic polymers of high acid value are mainly adopted because an aqueous alkali solution can be used as a patterning developer. In a pigment dispersion composed of the above-described pigment and an acrylic resin of high acid value, however, the particles of the pigment undergo flocculation, so that the viscosity of the pigment dispersion tends to rise. Further, the pigment dispersion becomes thicker with time, and therefore, has poor storage stability in many instances.

In the fabrication of a color filter (hereinafter, simply called "a CF") with such a pigment dispersion as accompanied by such difficulties as described above, the pigment dispersion is applied onto a substrate by a spin-coating method to form a colored film, and the colored film is then formed into pixels. When the viscosity of the pigment dispersion is high or when the pigment particles flocculate and the colored composition of CF shows thixotropic viscosity, the coated layer rises at a central part thereof prior to its formation into pixels. When a large-size color filter is fabricated, this rise becomes a cause for the occurrence of uniformity-lacking hues and density differences between the pixels formed at the central part and the pixels formed at the peripheral part of the substrate.

A colored composition for CF (pigment dispersion) generally has a pigment concentration in a high range of from 5 to 20 wt. %. None the less, the colored composition must be in a state dispersed without flocculation of pigment particles themselves, must have a viscosity (e.g., 5 to 20 mPa·s or so) lower than general room-temperature drying coating formulations or baking coating formulations, and must also be excellent in storage stability.

To meet the above-described requirements, it has conventionally been proposed that, when a red pigment is, for example, a diketopyrrolopyrrole pigment (for example, C.I. Pigment Red 254), one or more diketopyrrolopyrrole-sulfonic acids, each having a degree of sulfonation of 1 or higher, be added to the pigment or the pigment be treated with the sulfonated product (JP-A-2000-160084).

On the other hand, the utility of liquid crystal displays has expanded from monitors for personal computers to color displays in color television sets, leading to a demand for further improvements in the performance of CF. A need has, therefore, arisen for an improvement in the transparency of pixels, an increase in a contrast ratio of light transmitted through pixels, and an increase in the concentration of pigment in pixels.

With the above-described methods which make use of the sulfonated product, however, it is difficult to improve the transparency of pixels by relying upon an improvement in the dispersibility of the pigment or to avoid an increase in the viscosity of the pigment dispersion or a reduction in its storage stability due to a rise in the pigment concentration. Further, in the sulfonation of the diketopyrrolopyrrole pigment, it is difficult to control the number of sulfonic groups to be introduced therein. When a sulfonated product with many sulfonic groups introduced therein is used as a dispersant, flocculated matter may occur in the resulting pigment dispersion. There is also an outstanding desire for improvements in these respects.

SUMMARY OF THE INVENTION

The present inventors have proceeded with an extensive investigation to solve the above-described problems and to achieve an improvement in the color quality of the colored composition for making use for CF and a reduction in the viscosity of the colored composition and also to prevent the occurrence of flocculated matter in the colored composition. As a result, it has been found that the use of a condensed azo compound having sulfonic group(s) as a pigment dispersant makes it possible to achieve a reduction in the viscosity of a colored composition for CF, to avoid thickening and gelling of the colored composition during its storage, to prevent the occurrence of flocculated matter, and to improve the transparency of pixels. The transparency of the pixels is most important for the CF. These findings have led to the completion of the present invention.

The above-described objects can be achieved by the present invention to be described hereinafter. Described specifically, the present invention provides a pigment dispersant comprising the compound represented by the below-described formula (I) or a metal salt, ammonium salt, amine salt, or alkylammoniumchloride salt thereof.

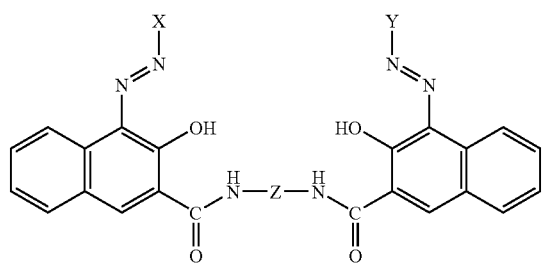

Formula (I)

The above dispersant according to the present invention comprises as a main component the compound represented by the above formula (I) and may comprise at least one member selected from the group consisting of the compounds represent by the below-described formula (II) and formula (III)

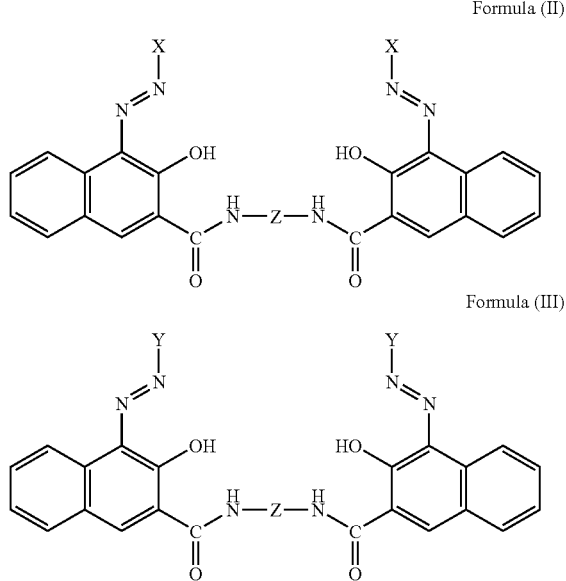

Formula (II)

Formula (III)

Further, the present invention provides a process for producing a pigment dispersant comprising a compound represented by said formula (I), wherein said process comprises a step of making a diazocoupling reaction of one mole of a diazonium salt of an aromatic or heterocyclic amine having at least one of a sulfonic group with one mole of the compound represented by the formula (IV), and subsequent to that, a step of making a diazocoupling reaction of one mole of a diazonium salt of an aromatic or heterocyclic amine having no sulfonic group with said reactant.

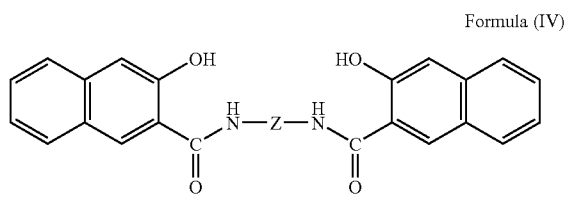

Formula (IV)

wherein in the above formulae (I) to (IV), X is a substituted or unsubstituted aromatic group or heterocyclic group, these groups each having at least one sulfonic group; Y is a aromatic group or heterocyclic group, which groups each may have one or more substituents other than a sulfonic group; Z is an aromatic group or heterocyclic group, which groups each may have one or more substituents other than a sulfonic group.

It is preferable in the above invention that specifically, Y is a 4-sulfophenyl group; X is a 2-chlor-5-trifluoromethylpheny group or 2,5-dichlorophenyl group; Z is a phenyl group or biphenyl group, which may have a substituent other than a sulfonic group.

The present invention also provides a colored composition for CF, comprising a pigment, the above-described pigment dispersant according to the present invention, a resin dispersant, and a resin varnish. The above pigment can, for example, be preferably at least one member selected from the group consisting of soluble or insoluble azo pigments, condensed azo pigments, benzimidazolone pigments, anthraquinone pigments, quinacridone pigments, diketopyrrolopyrrole pigments, perinone pigment, perylene pigments, dioxazine pigments, anthanthrone pigments, indigo or thioindigo pigments, and phthalocyanine pigments. A specifically preferable pigment can be at least one member selected from the group consisting of C.I. Pigment Red (PR) 254, PR 242, PR 177, PR 122, PR 224, PR 146, PR 166, C.I. Pigment Violet (PV) 19, PV 23, C.I. Pigment Blue (PB) 15:6, PB 15:3, and PB 60. The above resin dispersant can be preferably a cationic resin dispersant.

In addition, the present invention also provides a process for the fabrication of a CF, said process including a step of forming color pixels on a substrate for the CF, which comprises forming the color pixels using the above-described colored composition according to the present invention; a CF fabricated by the process; an image display device comprising the CF; and an information communication equipment comprising the image display device.

According to the present invention, the effect available from the use of the specific dispersant as a dispersant for colored compositions, which are useful for formation of, specifically red, purple, and blue pixels on CF, has made it possible to specifically prevent the flocculation of pigment particles; the colored composition can be stably prepared, and can avoid the occurrence of flocculated matter. The eventual use of the colored composition as a colored composition for CF can provide CF having color pixels, which have excellent spectral curve characteristics, can produce vivid and bright color tones, are high in transparency, and moreover, are excellent in various durabilities such as light resistance, heat resistance, solvent resistance, chemical resistance and waterproofness.

DETAILED DESCRIPTION OF THE INVENTION

The present invention will next be described in further detail based on the best mode for carrying out the invention. The pigment dispersant according to the present invention is characterized in that the dispersant comprises a main component a compound having a condensed azo structure including a sulfonic group. The pigment dispersant has an excellent compatibility with various pigments and can be used with many kinds of pigments in a wide range of application. Further, the pigment dispersant has an excellent pigment-dispersing power; it can be used for manufacturing a colored composition making use for the fabrication of CF.

The pigment dispersant according to the present invention, which comprises a compound represented by the formula (I), can be preferably manufactured by the following process. The process comprises: a first step of reacting the acid chloride of 3-hydroxy-2-naphthoic acid with a diaminoaromatic compound or heterocyclic compound, which may have a substituent other than a sulfonic group, in an inactive solvent such as nitrobenzene at the temperature of 110 to 180° C. to produce the compound represented by the formula (IV); a second step of, subsequent to said first step, dissolving and dispersing this compound preferably in an alkaline methanol to obtain a coupling component; a third step of, subsequent to said second step, diazotizing an aromatic amine compound or heterocyclic amine compound (amine compound A; about one (1) mole) by methods known per se in the art, and subsequently, coupling this diazonium compound to the coupling component (about one (1) mole); and then, a fourth step of, subsequent to said third step, diazotizing an aromatic amine compound or heterocyclic amine (amine compound B; about one (1) mole), which may have a substituent other than a sulfonic group, by methods known per se in the art, and subsequently, coupling this diazonium compound to said reactant in said third step.

In the above process, if amine compound B is primarily diazotized and coupled, the yield ratio of the compound represented by the formula (I) is lower; if amine compound A and amine compound B are concurrently diazotized and coupled, the yield ratio of the compound represented by the formula (I) is also lower. In the present invention, it is preferable to subject amine compound A and amine compound B separately in this order to a diazotizing reaction and coupling reaction because it can enhance a producing ratio of the compound represented by the above formula (I).

The dispersant according to the present invention can be obtained by the above process. The obtained compound has, however, a possibility of including at least one compound (hereinafter, called "a byproduct") selected from the group consisting of compounds (byproducts) represented by the formulae (II) and (III). The above dispersant can be used as a pigment dispersant without isolation of the byproducts. In addition, in the dispersant according to the present invention, the sulfonic group contained in the molecule may be free or in form of a base salt thereof.

Examples of the above amine compound A according to the present invention include o-aminobenzenesulfonic acid, m-aminobenzenesulfonic acid, sulfanilic acid, 2-chloroaniline-3-sulfonic acid, 4-chloroaniline-2-sulfonic acid, 4-chloroaniline-3-sulfonic acid, 2,5-dichloroaniline-4-sulfonic acid, 2-nitroaniline-4-sulfonic acid, 2-aminophenol-4-sulfonic acid, o-anisidine-5-sulfonic acid, p-anisidine-5-sulfonic acid, o-toluidine-4-sulfonic acid, m-toluidine-4-sulfonic acid, p-toluidine-2-sulfonic acid, 2-chloro-p-toluidine-3-sulfonic acid, 2-chloro-p-toluidine-5-sulfonic acid, 4-chloro-m-toluidine-2-sulfonic acid, 3-amino-6-chlorotoluene-4-sulfonic acid, 3-amino-6-chloro-4-sulfobenzoic acid, 1-amino-8-naphthalenesulfonic acid, 2-amino-1-naphthalenesulfonic acid, 4-amino-1-naphthalenesulfonic acid, 5-amino-1-naphthalenesulfonic acid, 6-amino-1-naphthalenesulfonic acid, 5-amino-3-naphthalenesulfonic acid, 4-amino-5-hydroxy-2,7-naphthalenedisulfonic acid, 1-amino-2-hydroxy-4-naphthalenesulfonic acid, 6-amino-4-hydroxy-2-naphthalenesulfonic acid, 7-amino-4-hydroxy-2-naphthalenesulfonic acid, 1-amino-2-anthraquinonesulfonic acid, 1-amino-5-anthraquinonesulfonic acid, 1-amino-8-anthraquinonesulfonic acid, 3-aminocarbazolesulfonic acid, 9-aminoacridinesulfonic acid, 6-aminoindazolesulfonic acid. Sulfanilic acid among those is specifically preferable as amine compound A.

Examples of the above amine compound B according to the present invention include aniline, toluidine (o-, m-, or p-), 2,4-xylidine, 3,4-xylidine, p-cresidine, anisidine (o-, m- or p-), aminophenol (o-, m- or p-), anthranilic acid, p-aminobenzoic acid, nitroaniline (o-, m- or p-), chloroaniline (o-, m- or p-), 2,5-dichloroaniline, 3,4-dichloroaniline, 3,5-dichloroaniline, 2,4,5-trichloroaniline, 2-chloro-4-nitroaniline, 5-chloro-2-nitroaniline, 2,6-dichloro-4-nitroaniline, o-fluoroaniline, 2,4-difluoroaniline, m-trifluoromethylaniline, 2-chloro-5-trifluoromethylaniline, 2-aminothiophenol, 2-amino-5-nitrobenzonitrile, 2-amino-3-bromo-5-nitrobenzonitrile, diphenylamine, 1-naphthylamine, 2-naphthylamine, 3-amino-9-ethylcarbazole, 2-aminothiazole, 2-amino-5-nitrothiazole, 2-aminobenzothiazole, 2-amino-6-methoxybenzothiazole, 1-aminoanthraquinone, 2-aminoanthraquinone, o-(phenylsulfonyl)aniline, 2-ethylsulfonyl-5-trifluoromethylaniline, 4-benzylsufonyl-o-anisidine, o-anisidine-4-sulfondiethylamide, o-anisidine-4-sulfonethyl, 6-benzamide-m-4-xylidine, 4,4-dichloro-2-aminodiphenylether, 4-benzamide-2,5-dimethoxyaniline, 9-aminoacridine, 6-aminoindazole and the like. Specifically preferable are 2,5-dichloroaniline and 2-chloro-5-trifluoromethylaniline as amine compound B.

Examples of diaminoaromatic compounds useful for production of the compound represented by the formula (I) include phenylenediamine (o-, m- or p-), 2-chloro-1,4-phenylenediamine, 2-methyl-1,4-phenylenediamine, 2,5-dichloro-1,4-phenylenediamine, 2,6-dichloro-1,4-phenylenediamine, 2-nitro-1,4-phenylenediamine, 2-cyano-1,4-phenylenediamine, 2,5-dimethyl-1,4-phenylenediamine, 2-chloro-5-methyl-1,4-phenylenediamine, 2,4-diaminotoluene, 2,5-diaminotoluene, 2,6-diaminotoluene, 3,4-diaminotoluene, 6-chloro-1,3-phenylenediamine, 5-chloro-1,2-phenylenediamine, 3,4-diaminobenzoic acid, 3,5-diaminobenzoic acid, 1,5-diaminonaphthalene, 1,8-diaminonaphthalene, 2,3-diaminonaphthalene, 3,3'-dichlorobenzidine, 3,3'-dimethoxybenzidine, 3,3'-dihydroxybenzidine, 3,3'-dichloro-4,4'-diaminodiphenylmethane, 4,4'-diamino-3,3'-diethyldiphenylmethane, 4,4'-diaminobenzanilide, 3,5-diaminochlorobenzene, 4,4'-diaminodiphenylether, 3,3'-dimethyl-4,4'-diaminodiphenylmethane, o-tolidine, m-toluylenediamine, bis(4-aminophenyl)sulfide, bis(3-aminophenyl)sulfone, bis(4-aminophenyl)sulfone, 2,6-diaminopyridine, 3,4-diaminopyridine, and the like. As a diaminoaromatic compounds, specifically preferable are phenylenediamine (o-, m- or p-), 2,5-dichloro-1,4-phenylenediamine and 3,3'-dichlorobenzidine.

Examples of the bases, which form salts with the sulfonic group contained in the compound represented by the formula (I), include alkali metals such as Li, Na, K and the like; multivalent metals such as Ca, Ba, Al, Mn, Sr, Mg and Ni; ammonia; (mono, di or tri)alkylamines, substituted or unsubstituted alkylenediamines, alkanolamines, alkylammonium chlorides and the like.

The colored composition according to the present invention for CF is composed of a pigment, the above-described pigment dispersion, a resin dispersant, and a resin varnish. Examples of the pigments for use in the present invention can include, as a red pigment, diketopyrrolopyrrole pigments, anthraquinone pigments, condensed azo pigments, quinacridone pigments, perylene pigments, and the like.

As the diketopyrrolopyrrole pigments, PR254 and the like can be mentioned; as the anthraquinone red pigments, PR 177 and the like; as the condensed azo pigments, PR242, PR166 and the like; as the quinacridone pigments, PR 122, PV19 and the like; and as the perylene pigments, PR224 and the like. At least one member selected from the group consisting of PR254, PR242, PR177, PR122, and PR224 can be a specifically preferable red pigment.

These pigments can be used each in a single and in combination with two or more pigments. Upon the use, a yellow pigment may be added and dispersed to correct the color hue. As such a yellow pigment, isoindoline pigment (C.I. Pigment Yellow (PY) 139), quinophthalone yellow pigment (PY 138), metal complex pigment (PY 150), disazo yellow pigment (PY 83) and the like can be used. The red pigment can be used generally in a proportion of from 5 to 500 parts by weight per 100 parts by weight of a resin binder in the below-descried resin varnish, although no particular limitation is imposed on the amount of the red pigment to be used.

As the ratio of the pigment dispersant to the pigment, the pigment dispersant may be added preferably at a ratio of from 0.05 to 40 parts by weight, more preferably at a ratio of from 0.1 to 10 parts by weight per 100 parts by weight of the pigment. An unduly small proportion of the dispersant makes it difficult to sufficiently bring about the intended advantageous effects of the dispersant. An excessively large proportion of the dispersant, on the other hand, cannot bring about its advantageous effects as much as the excessively large proportion used, but on the contrary, the resulting colored composition for CF is lowered in various physical properties, and moreover, the color hue of the pigment to be dispersed is substantially changed by the color which the dispersant itself has.

As the resin dispersant for use in the present invention, a known dispersant can be used, with a cationic resin dispersant being particularly preferred. Examples of the cationic resin dispersant include "DISPER BYK-160", "DISPER BYK-161", "DISPER BYK-162", "DISPER BYK-163", "DISPER BYK-164", "DISPER BYK-166", "DISPER BYK-171", "DISPER BYK-182", "DISPER BYK-184", "DISPER BYK-2000", "DISPER BYK-2001", "DISPER BYK-2070", and "DISPER BYK-2150" (trade names, products of BYK-Chemie GmbH, Germany); "EFKA-44", "EFKA-46", "EFKA-47", "EFKA-48", "EFKA-4010", "EFKA-4050", "EFKA-4055", "EFKA-4020", "EFKA-4015", "EFKA-4060", "EFKA-4300", "EFKA-4330", "EFKA-4400", "EFKA-4406", "EFKA-4510", and "EFKA-4800" (trade names, product of EFKA Additive BV, the Netherlands); "SOLSPERS-24000", "SOLSPERS-32550" and "NBZ-4204/10" (trade names, products of Avecia Limited United Kingdom, England); "HINOACT T-6000", "HINOACT T-7000", and "HINOAC T-8000" (trade names, products of Kawaken Fine Chemicals Co., Ltd.); "AJISPUR PB-821", "AJISPUR PB-822", and "AJISPUR PB-823" (trade names, products of Ajinomoto Co., Ltd.); and "FLORENE DOPA-17HF", "FLORENE DOPA-15BHF", "FLORENE DOPA-33", and "FLORENE DOPA-44" (trade name, products of Kyoeisha Chemical Co., Ltd.).

The amount of the resin dispersant to be used in the present invention may be preferably from 2 to 100 parts by weight, more preferably from 10 to 50 parts by weight per 100 parts by weight of the pigment, although no particular limitation is imposed thereon. An amount of the resin dispersant smaller than 2 parts by weight cannot provide the pigment with good dispersion stability, while an amount of the resin dispersant greater than 100 parts by weight may lead, in some instances, to a colored composition for CF, which cannot form films of good developability.

As the resin varnish employed as a dispersion medium for dispersing the pigment in the present invention, known resin varnishes conventionally used in colored compositions in CF are all usable, and no particular limitation is imposed thereon. In the resin varnish as a dispersion medium, an appropriate solvent or water-based medium is usable. Further, conventionally-known additives, for example, a dispersing aid, a leveling agent, a bonding agent and the like can be added and used suitably as needed.

As the resin varnish, either a photosensitive resin varnish or a non-photosensitive resin varnish can be used. Examples of the photosensitive resin varnish include photosensitive resin varnishes useful in ultraviolet-curable inks and electron-radiation-curable inks. Examples of the non-photosensitive resin varnish, on the other hand, include resin varnishes useful in printing inks such as letterpress inks, lithographic inks, intaglio gravure inks and stencil screen inks; resin varnishes useful for inkjet printing; resin varnishes useful for electrocoating; resin varnishes useful in developers for electric printing and electrostatic printing; and resin varnishes useful in thermal transfer films or ribbons.

Specific examples of the photosensitive resin varnish include varnishes such as photosensitive cyclic rubber resins, photosensitive phenol resins, photosensitive polyacrylate resins, photosensitive polyamide resins, photosensitive polyimide resins and the like, more specifically unsaturated polyester resins, polyester acrylate resins, polyepoxy acrylate resins, polyurethane acrylate resins, polyether acrylate resins, polyol acrylate resins and the like; and varnishes prepared by adding monomers as reactive diluents to such resins. As preferred resins among the above-described photosensitive resin varnishes, alkali-developable acrylate resins containing free carboxyl groups in their molecules can be mentioned.

Specific examples of the non-photosensitive resin varnish include cellulose acetate resins, nitrocellulose resins, styrene (co)polymers, polyvinyl butyral resins, aminoalkyd resins, polyester resins, amino-resin-modified polyester resins, polyurethane resins, acrylic polyol urethane resins, soluble polyamide resins, soluble polyimide resins, soluble polyamide-imide resins, soluble polyester-imide resins, hydroxyethylcellulose, water-soluble salts of styrene-maleate ester copolymers, water-soluble salts of (meth)acrylate ester (co)polymers, water-soluble aminoalkyd resins, water-soluble aminopolyester resins, and water-soluble polyamide resins. They can be used either singly or in combination.

No particular limitation is imposed on the method for the preparation of the colored composition—according to the present invention—formed of the above-described respective components. As illustrative, however, the following methods can be mentioned:

(a) After the pigment and pigment dispersant are dissolved in sulfuric acid or the like, the resulting solution is poured into water such that both of them are allowed to precipitate as a solid solution. The solid solution is then added together with the cationic resin dispersant to the resin varnish, followed by kneading.

(b) The pigment is evenly suspended in water or an organic solvent. A solution with the pigment dispersant contained therein is added to the suspension to have the pigment dispersant precipitated on the surfaces of the pigment particles. The pigment particles with the pigment dispersant precipitated thereon is added together with the cationic resin dispersant to the resin varnish, and the resulting mass is kneaded.

(c) The pigment, pigment dispersant and cationic resin dispersant are finely dispersed in a wet-type, medium-containing disperser such as an attritor or ball mill. The resin varnish is then added, followed by kneading.

(d) The pigment, pigment dispersant and cationic resin dispersant are added to the resin varnish at the time of premixing, and the resulting mixture is subjected to dispersion processing in a wet-type, medium-containing disperser.

When a photosensitive resin varnish is used as a resin varnish upon fabrication of CF with the colored composition according to the present invention, a conventionally-known, photopolymerization initiator such as benzoin ether or benzophenone is added to the composition, the thus-obtained mass is kneaded by a conventionally-known method, and the resulting colored photosensitive composition is then used. It is to be noted that the colored composition according to the present invention can also be used as a thermopolymerizable colored composition by using a thermopolymerization initiator in place of the above-described photopolymerization initiator.

Upon forming pixels for a CF on a substrate by using the above-described photosensitive colored composition, a transparent substrate is subjected to full-area coating with the photosensitive colored composition, for example, by using a spin coater, a low-speed rotary coater, a roll coater, a knife coater or the like, or by suitable one of various printing process, the transparent substrate is subjected to full-area printing or is subjected to partial-area printing at areas somewhat greater than pixels. Subsequent to pre-drying, a photomask is brought into close contact with the coated or printed surface of the transparent substrate, and using an extra-high pressure mercury vapor lamp, exposure is then conducted to bake the pixels. Subsequently, development and washing are conducted, and post-baking is carried out as needed, to form the pixels. This process itself for the formation of pixels is known to the public, and no particular limitation is imposed on the formation process of pixels for CF.

Upon forming pixels for a CF with a colored composition (non-photosensitive colored composition) of this invention which makes use of a non-photosensitive resin varnish, for example, the non-photosensitive colored composition can be printed as a printing ink for the color filter on the transparent substrate by suitable one of the above-described various printing processes to form the pixels on the substrate, can be applied as a water-based electrocoating composition for CF onto the transparent substrate by an electrocoating process to form the pixels on the substrate, can be printed as an inkjet ink on the transparent substrate by an inkjet printing process to form the pixels on the substrate, or can be applied onto a transfer substrate by an electroprinting process, an electrostatic printing process or one of the above-described processes or by a like process to once form pixels, and then the formed pixels are transferred onto a substrate for the CF. Subsequently, by methods known per se in the art, baking may be conducted, polishing may be conducted to level the surface, and/or top coating may be conducted to protect the surface, as needed. Further, a black matrix is formed by a method known per se in the art. In this manner, a CF having R, G and B pixels can be obtained. These fabrication processes for CF are by themselves known to the public, and in the present invention, no particular limitation is imposed on the fabrication process of CF.

EXAMPLES

Based on Synthesis Examples, Examples and Comparative Examples, the present invention will next be described more specifically. It is to be noted that all designations of "part", "parts" and "%" are on a weight basis.

Synthesis Example 1

In a manner known per se in the art, 3-hydroxy-2-naphthoic acid (60 parts) was converted into an acid chloride with thionyl chloride (40 parts) in nitrobenzene (400 parts), 2,5-dichloro-1,4-phenylenediamine (25 parts) was added, and the resulting mixture was heated at 130 to 135° C. for 5 hours. Subsequent to cooling, methanol (200 parts) was added. The resulting precipitate was collected by filtration, washed with methanol and then with water, and dried to obtain a reactant (60 parts).

To an aliquot (10 parts) (0.02 mole) of the reactant, methanol (100 parts), sodium hydroxide (3 parts) and sodium acetate trihydrate (11 parts) were added to prepare a grounder solution. Sulfanilic acid (3.5 parts) (0.02 mole) was diazotized by a method known per se in the art, and the diazotized reactant was then caused to couple to the grounder solution. One hour later, 2-chloro-5-trifluoromethylaniline (4.3 parts) (0.022 mole) was diazotized by a method known per se in the art, and the diazotized reactant was also caused to couple to obtain a pigment dispersant (A) (15 parts) comprising as a main component the compound represented by the below-described formula, which dispersant (A) was determined to contain on average 1 sulfonic group introduced per molecule from the results of an elemental analysis for sulfur.

Pigment dispersant (A)

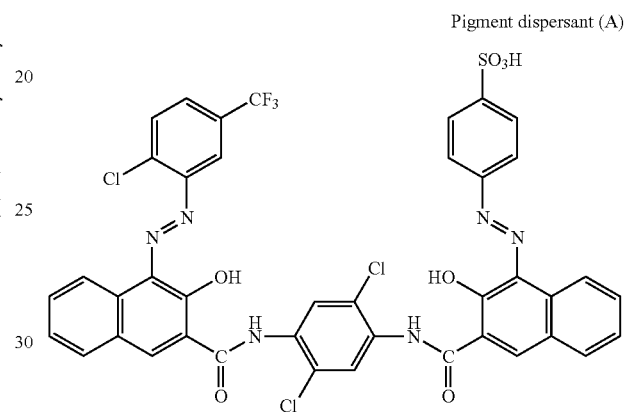

The above reactant had a possibility to contain the byproducts described by the below formulae, but the removal of the byproducts from the reactant was not needed.

Byproduct

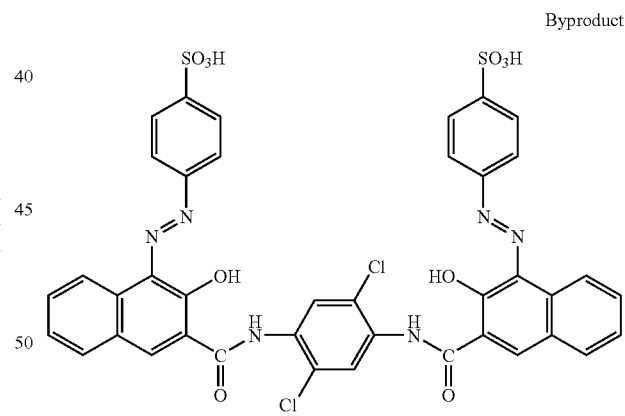

Byproduct

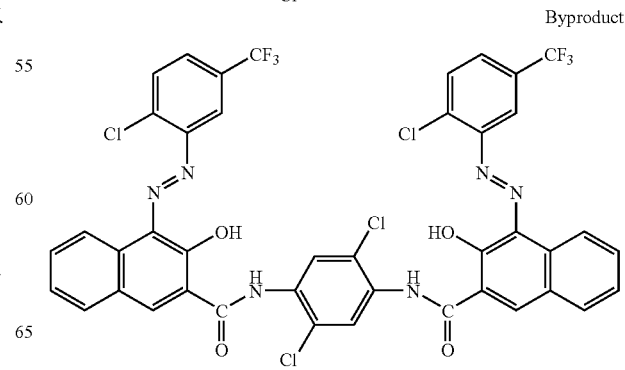

Synthesis Example 2

In a similar manner as in Synthesis Example 1 except for the use of 3,3'-dichlorobenzidine (35 parts) in place of 2,5-dichloro-1,4-phenylenediamine (25 parts), there was obtained the pigment dispersant (B) (15 parts) comprising as a main component the compound represented by the below-described formula, which dispersant (B) was determined to contain on average 1 sulfonic group introduced per molecule from the results of an elemental analysis for sulfur.

Pigment dispersant (B)

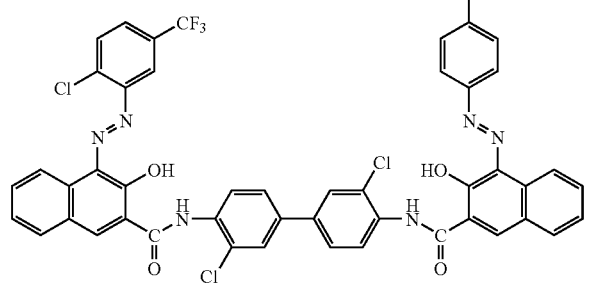

The above reactant had a possibility to contain the byproducts described by the below formulae, but the removal of the byproducts from the reactant was not needed.

Byproduct

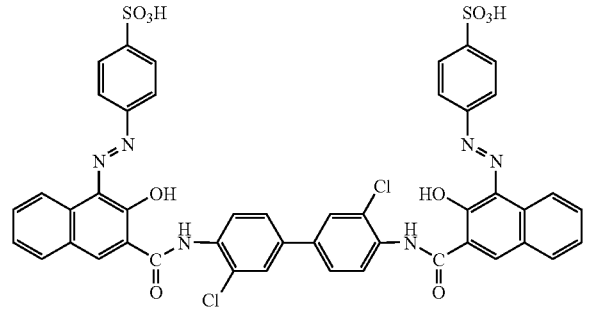

Byproduct

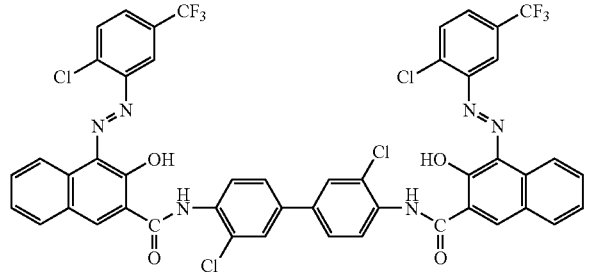

Synthesis Example 3

In a manner known per se in the art, 3-hydroxy-2-naphthoic acid (60 parts) was converted into an acid chloride with thionyl chloride (40 parts) in nitrobenzene (400 parts), 1,4-phenylenediamine (17 parts) was added, and the resulting mixture was heated at 130 to 135° C. for 5 hours. Subsequent to cooling, methanol (200 parts) was added. The resulting precipitate was collected by filtration, washed with methanol and then with water, and dried to obtain a reactant (57 parts). To an aliquot (10 parts) (0.022 mole) of the reactant, methanol (100 parts), sodium hydroxide (3 parts) and sodium acetate trihydrate (11 parts) were added to prepare a grounder solution. Sulfanilic acid (3.9 parts) (0.022 mole) was diazotized by a method known per se in the art; and the diazotized reactant was then caused to couple to the grounder solution. One hour later, 2,5-dichloroaniline (4 parts) (0.025 mole) was diazotized by a method known per se in the art, and the diazotized reactant was also caused to couple to obtain a pigment dispersant C (16 parts) comprising as a main component the compound represented by the below-described formula, which dispersant (C) was determined to contain on average 1 sulfonic group introduced per molecule from the results of an elemental analysis for sulfur.

Pigment dispersant (C)

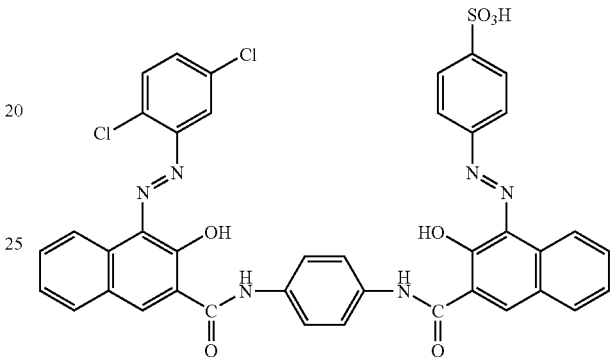

The above reactant had a possibility to contain the byproducts described by the below formulae, but the removal of the byproducts from the reactant was not needed.

Byproduct

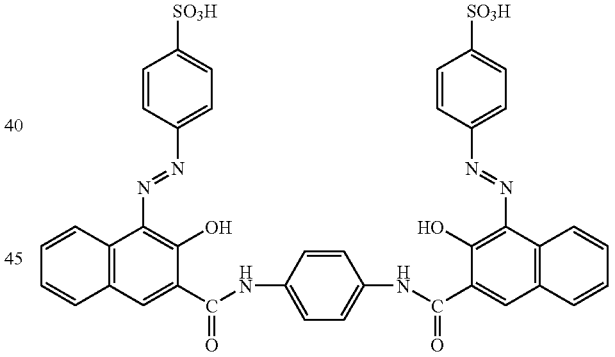

Byproduct

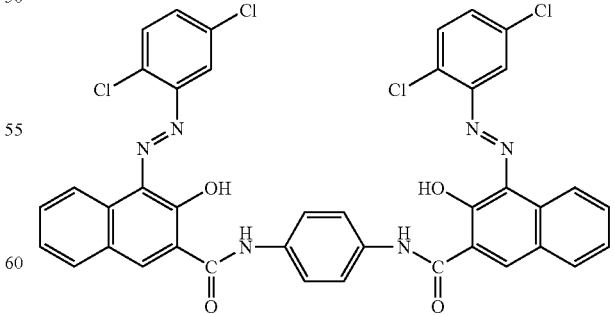

Example 1

To an acrylic resin varnish (a copolymerization product of methacrylic acid, butyl acrylate, styrene and hydroxyethyl acrylate at a molar ratio of 25/50/15/10, molecular weight: 12,000, solid content: 30%; 50 parts), PR 254 (20 parts), the pigment dispersant A (1 part) obtained in Synthesis Example 1, a cationic resin dispersant (4 parts) and a solvent (propylene glycol monomethyl ether acetate, hereinafter abbreviated as "PGMAc"; 20 parts) were added. Subsequent to premixing, the resultant mixture was dispersed in a horizontal bead mill to obtain a red-colored composition for CF.

Examples 2 and 3

Two kinds of red-colored compositions for CF—each independently having a specific combination of the pigment and pigment dispersant described in Table 1—were obtained in a similar manner as in Example 1 except that instead of the pigment dispersant (A) used in Example 1, pigment dispersants (B) and (C) of Synthesis Examples 2 and 3 were used in Examples 2 and 3, respectively, as a pigment dispersant.

Examples 4 to 6

Three kinds of red-colored compositions for CF—each independently having a specific combination of the pigment and pigment dispersant described in Table 1—were obtained in a similar manner as in Example 1 except that instead of PR 254 used Example 1, PR 177 was used, and the pigment dispersants (B) and (C) of Synthesis Examples 2 and 3 were used in Examples 5 and 6, respectively, as a pigment dispersant instead of the pigment dispersant (A) used in Example 1.

Examples 7 to 9

Three kinds of red-colored compositions for CF—each independently having a specific combination of the pigment and pigment dispersant described in Table 1—were obtained in a similar manner as in Example 1 except that instead of PR 254 used in Example 1, PR 242 was used, and the pigment dispersants (B) and (C) of Synthesis Examples 2 and 3 were used in Examples 8 and 9, respectively, as a pigment dispersant instead of the pigment dispersant (A) used in Example 1.

Examples 10 to 12

Three kinds of red-colored compositions for CF—each independently having a specific combination of the pigment and pigment dispersant described in Table 1—were obtained in a similar manner as in Example 1 except that instead of PR 254 used in Example 1, PR 122 was used, and the pigment dispersants (B) and (C) of Synthesis Examples 2 and 3 were used in Examples 11 and 12, respectively, as a pigment dispersant instead of the pigment dispersant (A).

Examples 13 to 15

Three kinds of red-colored compositions for CF—each independently having a specific combination of the pigment and pigment dispersant described in Table 1—were obtained in a similar manner as in Example 1 except that instead of PR 254 used in Example 1, PR 224 was used, and the pigment dispersants (B) and (C) of Synthesis Examples 2 and 3 were used in Examples 14 and 15, respectively, as a pigment dispersant instead of the pigment dispersant (A).

Comparative Examples 1 to 5

Five kinds of red-colored compositions—each independently having the pigments described in Table 1—for CF were obtained in a similar manner as in Examples 1, 4, 7, 10, and 13, respectively, except that the pigment dispersant (A) was not used.

The colored compositions of Examples 1 to 15 were compared in fluidity, the gloss of a color-coated surface and the occurrence or non-occurrence of flocculated matter with those of Comparative Examples 1 to 5. With respect to each colored composition for CF, its fluidity and its gloss of a color-coated surface were measured in accordance with the below-described methods, respectively, and further, it was observed by the below-described method to determine whether flocculated or not flocculated matter existed. The measurement and observation results of the colored compositions of Examples 1 to 15 both before and after their storage at a temperature of 25° C. for one (1) month were assessed relative to those of the colored compositions of Comparative Examples 1 to 5.

Fluidity (Change of Viscosity):

Using an E-type viscometer, the fluidity of each colored composition for CF was measured under the conditions of room temperature (25° C.) and 6 rpm rotor speed.

Gloss: Using a bar coater (thickness of wiring: 0.45 mm), the colored compositions for CF were separately coated on polypropylene films, and the glosses of the color-coated surfaces were compared visually and by a glossimeter. Those high in gloss were ranked good, and the comparison results were indicated in accordance with the following ranking indexes.

A: Good

B: Fair

C: Poor

Observation for flocculated matter:

Each colored composition for CF was applied onto a glass substrate by a spinner. After dried into a film at 90° C. for 2 minutes, the film was observed for any flocculated matter at 200-folds magnification under a microscope. The observation results were indicated in accordance with the following ranking indexes.

A: No flocculated matter

B: Some flocculated matter

C: Substantial flocculated matter

The above measurement and ranking results are shown in Tables 1-1 and 1-2.

TABLE 1-1

| Colored composition for CF | Pigment dispersant # | Pigment | Viscosity (mPa·s) Before storage | Viscosity (mPa·s) After storage | Gloss Before storage | Gloss After storage | Observation for flocculated matter Before storage | Observation for flocculated matter After storage |
|---|---|---|---|---|---|---|---|---|
| Ex. 1 | A | PR254 | 23 | 25 | A | A | A | A |
| Ex. 2 | B | PR254 | 20 | 22 | A | A | A | A |
| Ex. 3 | C | PR254 | 22 | 23 | A | A | A | A |
| Ex. 4 | A | PR177 | 23 | 24 | A | A | A | A |
| Ex. 5 | B | PR177 | 22 | 23 | A | A | A | A |
| Ex. 6 | C | PR177 | 24 | 25 | A | A | A | A |
| Ex. 7 | A | PR242 | 25 | 25 | A | A | A | A |
| Ex. 8 | B | PR242 | 25 | 24 | A | A | A | A |
| Ex. 9 | C | PR242 | 27 | 28 | A | A | A | A |
| Ex. 10 | A | PR122 | 23 | 24 | A | A | A | A |
| Ex. 11 | B | PR122 | 22 | 23 | A | A | A | A |

TABLE 1-2

| Colored composition for CF | Pigment dispersant # | Pigment | Viscosity (mPa · s) Before storage | Viscosity (mPa · s) After storage | Gloss Before storage | Gloss After storage | Observation for flocculated matter Before storage | Observation for flocculated matter After storage |
|---|---|---|---|---|---|---|---|---|
| Ex. 12 | C | PR122 | 24 | 25 | A | A | A | A |
| Ex. 13 | A | PR224 | 23 | 24 | A | A | A | A |
| Ex. 14 | B | PR224 | 22 | 23 | A | A | A | A |
| Ex. 15 | C | PR224 | 24 | 25 | A | A | A | A |
| Comp. Ex. 1 | No | PR254 | 89 | gelling | C | C | B | C |
| Comp. Ex. 2 | No | PR177 | 91 | gelling | C | C | B | C |
| Comp. Ex. 3 | No | PR242 | 187 | gelling | C | C | C | C |
| Comp. Ex. 4 | No | PR122 | 98 | gelling | C | C | B | C |
| Comp. Ex. 5 | No | PR224 | 96 | gelling | C | C | B | C |

As appreciated from Tables 1-1 and 1-2, the colored compositions for CF of Examples 1 to 15, in which the pigment dispersants A to C were used, respectively, were lower in the viscosity after storage (one month later) and better in gloss in comparison with the colored compositions of Comparative Examples 1 to 5 in which the pigment dispersant was not used; and those compositions were free from the occurrence of flocculated matter both before and after the storage although the comparative compositions were not free from the occurrence, and therefore, were provided with excellent properties as colored compositions for CF.

Referential Example 1

To an acrylic resin varnish (50 parts) of the same kind as that used in Example 1, a brominated and chlorinated phthalocyanine green pigment (C.I. Pigment Green 36, 17 parts), and a quinophthalone yellow pigment (C.I. Pigment Yellow 138, 13 parts) as a pigment; a monosulfonated quinophthalone yellow (2 parts) as a pigment dispersant; a cationic resin dispersant (4 parts); and PGMAc (20 parts) were added. Subsequent to premixing, the resultant mixture was dispersed in a horizontal bead mill to obtain a green-colored composition for CF.

Referential Example 2

To an acrylic resin varnish (50 parts) of the same kind as that used in Example 1, an ε-copper phthalocyanine blue pigment (C.I. Pigment Blue 15:6, 16 parts), a dioxazine violet pigment (C.I. Pigment Violet 23, 4 parts) as a pigment; a monosulfonated phthalocyanine blue (2 parts) and monosulfonated indanthrone (1 part) as a pigment dispersant, a cationic resin dispersant (4 parts) and PGMAc (20 parts) were added. Subsequent to premixing, the resultant mixture was dispersed in a horizontal bead mill to obtain a blue-colored composition for CF.

Example 16

To fabricate an RGB color filter, a red-, green- and blue-colored compositions for CF were obtained in accordance with the formulations shown below in Table 2.

TABLE 2

| Formulation (parts) | Colored composition R | Colored composition G | Colored composition B |
|---|---|---|---|
| Red-colored composition of Example 1 | 100 | — | — |
| Green-colored composition of Referential Example 1 | — | 100 | — |
| Blue-colored composition of Referential Example 2 | — | — | 100 |
| Acrylic resin varnish | 50 | 50 | 50 |
| Trimethylolpropane acrylate | 10 | 10 | 10 |
| 2-Hydroxy-2-methylpropiophenone | 2 | 2 | 2 |
| 2,2-Diethoxyacetophenone | 1 | 1 | 1 |
| PGMAc | 37 | 37 | 37 |
| Total | 200 | 200 | 200 |

A glass substrate which had been treated with a silane coupling agent was set on a spin coater, and the red-colored composition in Table 2 was spin-coated under the conditions of at 300 rpm for 5 seconds firstly and at 1,200 rpm for 5 seconds secondly. Prebaking was then conducted at 80° C. for 10 minutes, a photomask having a mosaic-form pixel pattern was brought into close contact with the prebaked film, and using an extra-high pressure mercury vapor lamp, exposure was then conducted at a light quantity of 100 mJ/cm$^2$. Development and washing were then conducted with an exclusive developer and an exclusive rinse, respectively, to form red-colored mosaic pixels on the glass substrate. Subsequently, green-colored mosaic pixels and blue-colored mosaic pixels were formed by using the green-colored composition and blue-colored composition in Table 2 and conducting their coating and baking in a similar manner as described above. As a results, a CF having R, G and B pixels was obtained. The thus-obtained color filter had excellent spectral curve characteristics, was excellent in the durabilities such as light resistance and heat resistance of the respective pixels, was also superb in light transmission properties, and exhibited outstanding properties as a CF for a liquid-crystal color display.

This application claims the priority of Japanese Patent Application 2005-121044 filed Apr. 19, 2005, which is incorporated herein by reference.

The invention claimed is:

1. A pigment dispersant comprising the compound represented by the following formula (I) or a metal salt, ammonium salt, amine salt or alkylammoniumchloride salt thereof:

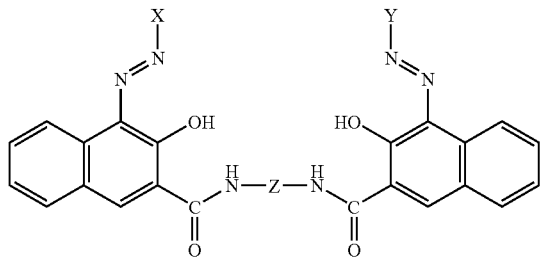

Formula (I)

wherein X is a substituted or unsubstituted aromatic or heterocyclic group having at least one of a sulfonic group; Y is an aromatic or heterocyclic group, said groups each may include one or more substitutes other than a sulfonic group; and Z is an aromatic or heterocyclic group, said groups each may include one or more substitutes other than a sulfonic group.

2. A pigment dispersant according to claim 1, wherein Y is a 4-sulfophenyl group; X is a 2-chlor-5-trifluoromethylphenyl or 2,5-dichlorophenyl group; Z is a phenyl or biphenyl group, said groups each may include one or more substitutes other than a sulfonic group.

3. A pigment dispersant according to claim 1, wherein said pigment dispersant comprises as a main component the compound represented by said formula (I) and may comprise at least one member selected from the group consisting of a compound represented by the formula (II) and a compound represented by the formula (III):

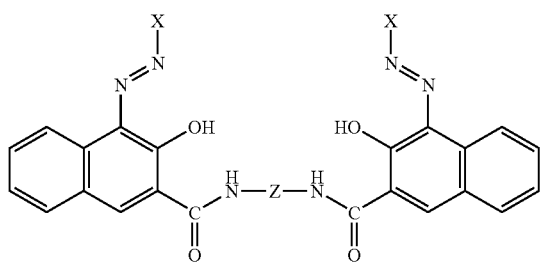

Formula (II)

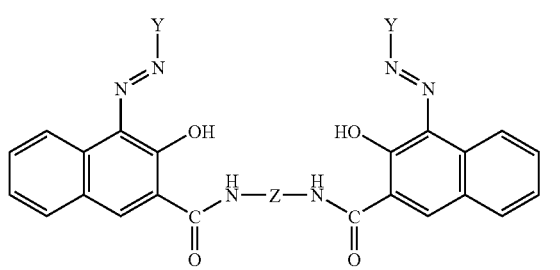

Formula (III)

wherein X is a substituted or unsubstituted aromatic or heterocyclic group having at least one of a sulfonic group; Y is an aromatic or heterocyclic group, said groups each may include one or more substitutes other than a sulfonic group; and Z is an aromatic or heterocyclic group, said groups each may include one or more substitutes other than a sulfonic group.

4. A pigment dispersant according to claim 3, wherein Y is a 4-sulfophenyl group; X is a 2-chlor-5-trifluoromethylphenyl or 2,5-dichlorophenyl group; Z is a phenyl or biphenyl group, said groups each may one or more substitutes other than a sulfonic group.

5. A process for producing a pigment dispersant comprising a compound represented by said formula (I) according to claim 1, wherein said process comprises a step of coupling one mole of a diazonium salt of an aromatic or heterocyclic amine compound having at least one of a sulfonic group to one mole of the compound represented by the formula (IV), and a step of, subsequent to said step, coupling one mole of a diazonium salt of an aromatic or heterocyclic amine compound having no sulfonic group to said reactant:

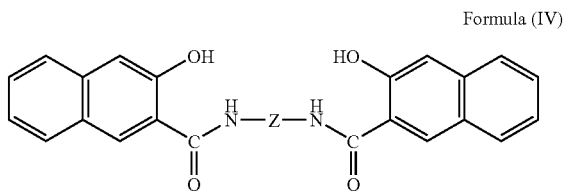

Formula (IV)

wherein Z is an aromatic group or heterocyclic group, said groups each may have one or more substituents other than a sulfonic group.

6. A colored composition for color filter, comprising a pigment, a pigment dispersant according to claim 1, a resin dispersant, and a resin varnish.

7. A colored composition according to claim 6, wherein said pigment comprises at least one member selected from the group consisting of soluble or insoluble azo pigments, condensed azo pigments, benzimidazolone pigments, anthraquinone pigments, quinacridone pigments, diketopyrrolopyrrole pigments, perinone pigments, perylene pigments, dioxazine pigments, anthanthrone pigments, indigo or thioindigo pigments, and phthalocyanine pigments.

8. A colored composition according to claim 6, wherein said pigment is at least one member selected from the group consisting of C.I. Pigment Red 254, C.I. Pigment Red 242, C.I. Pigment Red 177, C.I. Pigment Red 122, C.I. Pigment Red 146, C.I. Pigment Red 166, C.I. Pigment Red 224, C.I. Pigment Violet 19, C.I. Pigment Violet 23, C.I. Pigment Blue 15:6, C.I. Pigment Blue 15:3, and C.I. Pigment Blue 60.

9. A colored composition according to claim 6, wherein said resin dispersant is a cationic resin dispersant.

10. A process for the fabrication of a color filter, said process including a step of forming color pixels on a substrate for said color filter, which comprises forming said color pixels with a colored composition according to claim 6.

11. A color filter fabricated by a process according to claim 10.

* * * * *